(12) United States Patent
Edwards (10) Patent No.: US 10,418,306 B1
(45) Date of Patent: Sep. 17, 2019

(54) THERMAL INTERFACE FOR ELECTRONICS

(71) Applicant: TRW AUTOMOTIVE U.S. LLC, Livonia, MI (US)

(72) Inventor: Darryl Edwards, Novi, MI (US)

(73) Assignee: TRW AUTOMOTIVE U.S. LLC, Livonia, MI (US)

( * ) Notice: Subject to any disclaimer, the term of this patent is extended or adjusted under 35 U.S.C. 154(b) by 0 days.

(21) Appl. No.: 16/015,265

(22) Filed: Jun. 22, 2018

(51) Int. Cl.
| | |
|---|---|
| *H01L 23/373* | (2006.01) |
| *H01L 23/04* | (2006.01) |
| *H01L 23/36* | (2006.01) |
| *H01L 23/367* | (2006.01) |

(52) U.S. Cl.
CPC .......... *H01L 23/3733* (2013.01); *H01L 23/04* (2013.01); *H01L 23/3675* (2013.01)

(58) Field of Classification Search
CPC . H01L 23/3733; H01L 23/3675; H01L 23/04; H01L 2924/0002; H01L 2924/00; H01L 23/373; H01L 2023/4062; H01L 2023/4068; F28F 21/02; F28F 2013/001; F28F 2013/006; F28F 2275/025

USPC .................... 257/712, 675; 156/72
See application file for complete search history.

(56) References Cited

U.S. PATENT DOCUMENTS

| | | | |
|---|---|---|---|
| 6,119,573 A | 9/2000 | Berens et al. | |
| 2002/0145194 A1* | 10/2002 | O'Connor | H01L 23/3735 257/712 |
| 2006/0213599 A1* | 9/2006 | Knowles | B82Y 10/00 156/72 |
| 2007/0145546 A1* | 6/2007 | Lewis | H01L 23/3735 257/675 |
| 2015/0168086 A1 | 6/2015 | Knowles et al. | |
| 2017/0012260 A1 | 1/2017 | Knowles et al. | |
| 2017/0108297 A1 | 4/2017 | Knowles et al. | |

* cited by examiner

*Primary Examiner* — Caleen O Sullivan
(74) *Attorney, Agent, or Firm* — Tarolli, Sundheim, Covell & Tummino LLP (57) ABSTRACT

A thermal interface for positioning between an electronics packaging and a target object includes a pad having a first side facing one of the electronics packaging and the target object and a second side. Carbon fibers having varying lengths extend from the second side towards the other of the electronics packaging and the target object.

22 Claims, 7 Drawing Sheets

THERMAL INTERFACE FOR ELECTRONICS

TECHNICAL FIELD

The present invention relates generally to a thermal interface for electronics and, more specifically, relates to a thermal interface having carbon fibers for directing heat away from electronics packaging.

BACKGROUND

Thermal interfaces are used in electronics for controlling heat flux through the device. In the case of ball grid array packages, the thermal interface typically includes additives to help increase thermal conductivity. These additives, however, can harden the thermal interface and place undue stress on the package.

SUMMARY

In one example, a thermal interface for positioning between an electronics packaging and a target object includes a pad having a first side facing one of the electronics packaging and the target object and a second side. Carbon fibers having varying lengths extend from the second side towards the other of the electronics packaging and the target object.

In another example, a thermal interface for positioning between an electronics packaging and a target object includes a first pad having a first side for securing to the target object and a second side. Carbon fibers extend from the second side towards the electronics packaging. A second pad has a first side for securing to the electronics packaging and a second side. Carbon fibers extend from the second side towards the first pad so as to be interspersed with the fibers on the first pad.

In another example, a thermal interface for positioning between an electronics packaging and a target object includes at least one heat spreader material engaging the target object and the electronics packaging. The at least one heat spreader material includes a portion extending outward of the electronics package such that the at least one heat spreader material has a larger footprint than the electronics packaging.

Other objects and advantages and a fuller understanding of the invention will be had from the following detailed description and the accompanying drawings.

DETAILED DESCRIPTION

Figure 1A:
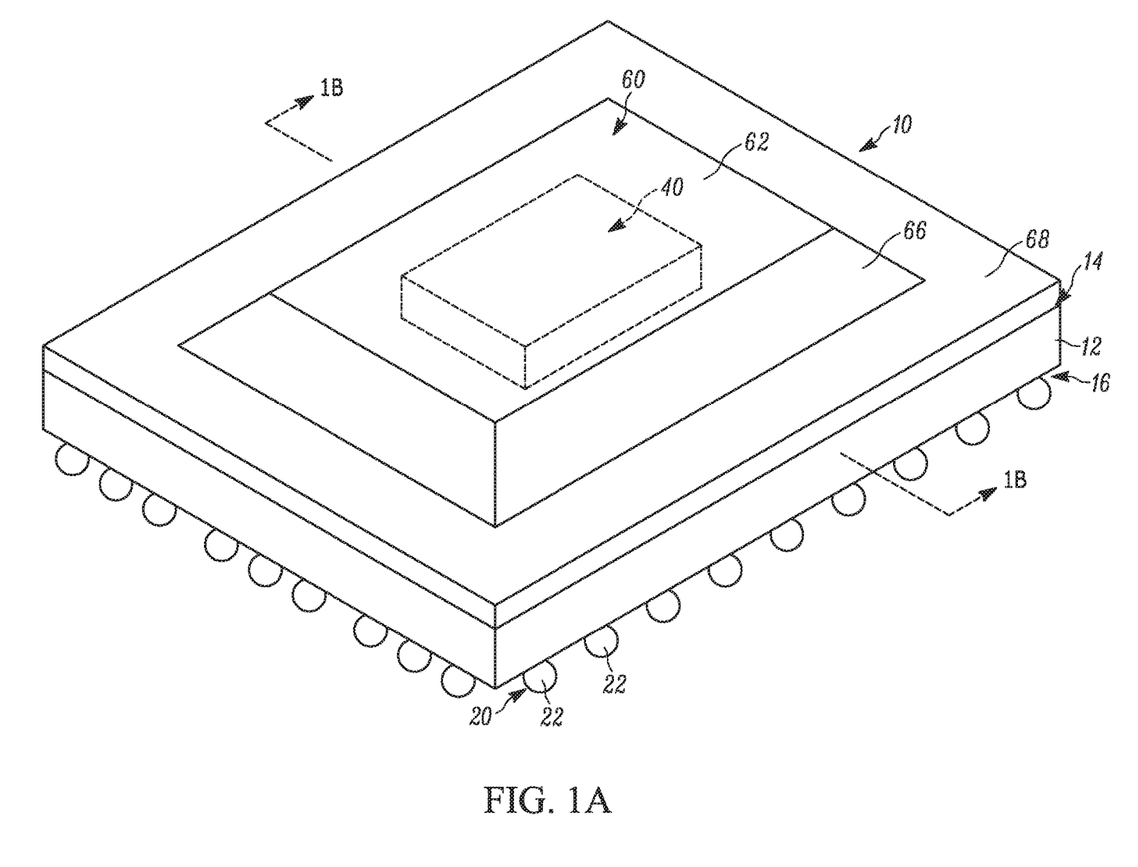
FIG. 1A is a schematic illustration of example electronics packaging.
Figure 1B:
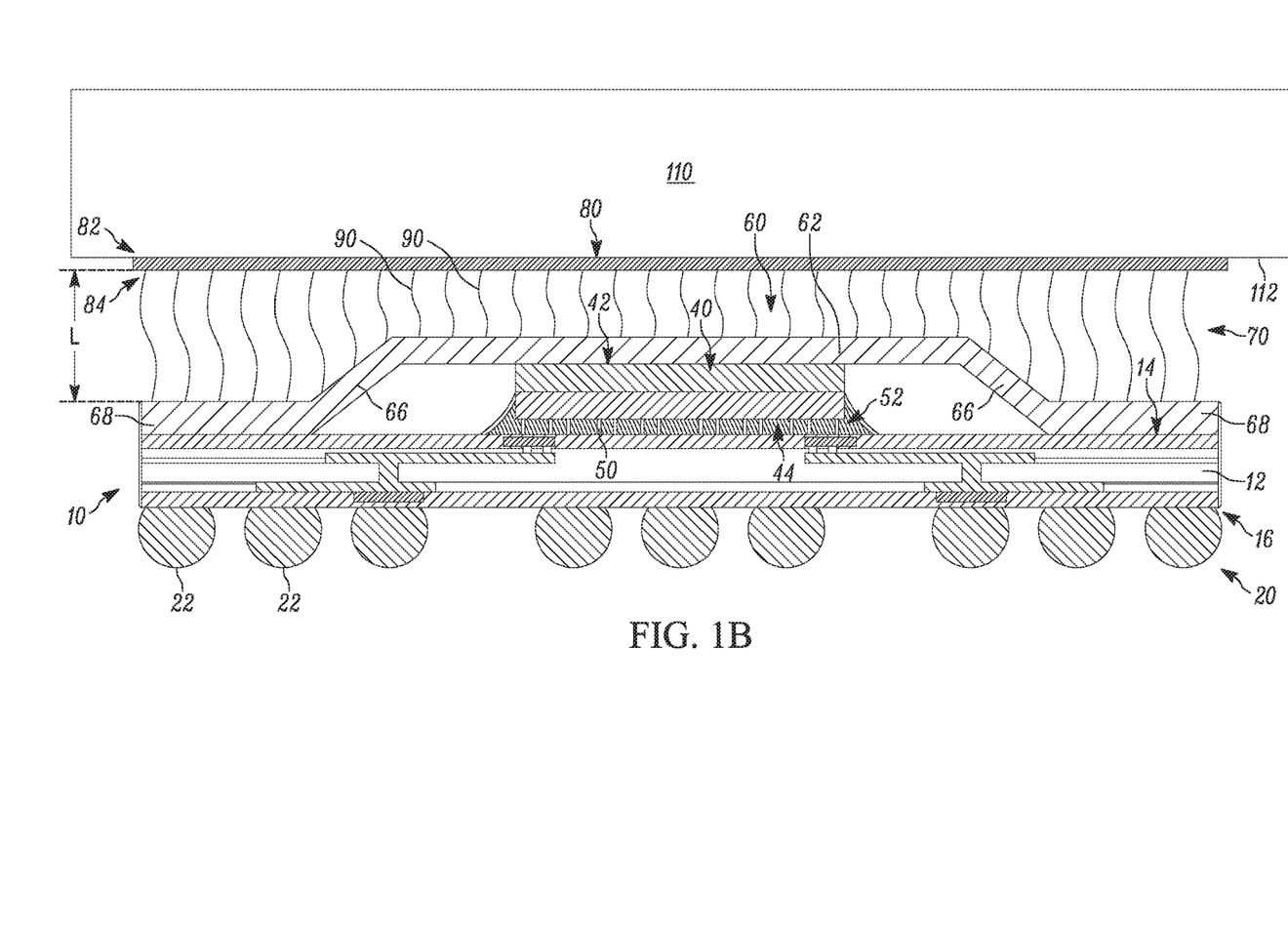
FIG. 1B is a section view of FIG. 1A taken along line 1B-1B in which the electronics packaging includes a thermal interface with fibers in accordance with the present invention.

The present invention relates generally to a thermal interface for electronics and, more specifically, relates to a thermal interface having carbon fibers for directing heat away from electronics packaging. FIGS. 1A-1B illustrate electronics packaging 10 including a thermal interface 70 in accordance with the present invention. The electronics packaging 10 can be an integrated circuit, including a through-hole package; surface mount; chip carrier; pin grid array; flat package; small outline package; chip-scale package; ball grid array (BGA); flip-chip BGA; flip-chip, thermally enhanced BGA; a transistor, diode, and small pin count package; or a multi-chip package. As shown, the electronics packaging 10 is a flip-chip, thermally enhanced BGA. The electronics packaging 10 can be used in vehicle systems, such as advanced driver assistance cameras.

The electronics packaging includes a substrate 12 having a first side 14 and a second side 16 opposite the first side. The first and second sides 14, 16 extend generally parallel to each other. The substrate 12 is rectangular and can be formed from multiple layers of ceramic material.

A die 40 is secured to the first side 14 of the substrate 12 by pins or solder 50. Underfill 52 covers the underside of the die 40 and the solder 50. The underfill 52 can be a polymer or liquid applied to the interface between the die 40 and the first side 14 of the substrate 12 in a melted state and allowed to solidify.

Solder 20 is connected to the second side 16 of the substrate 12. The solder 20 can be an array, such as a BGA, for securing the electronics packaging 10 to another substrate or printed circuit board (not shown).

A case or lid 60 can cover the die 40 and has substantially the same footprint as the substrate 12. Consequently, the lid 60 can be rectangular. The lid 60 is formed from a thermally conductive material, such as copper, and includes a planar base 62. An angled portion 66 extends outward from the base 62 to an end portion 68. The end portion 68 extends from the angled portion 66 and is parallel to the base 62. The base 62 abuts a first side 42 of the die 40. Alternatively, thermal grease (not shown) provides an interface between the base 62 and the first side 42. It will be appreciated that the lid 60 is omitted in some electronics packaging 10, such as in a standard BGA (not shown).

A thermal interface 70 is provided between the electronics packaging 10 and a target object 110, such as another substrate, heat pipe or sink, cold pipe or plate, integrated circuit, housing or other surface or object to conduct heat from or to. A surface 112 of the target object 110 faces the electronics packaging 10. The thermal interface 70 spans at least a portion of the gap or space between the electronics packaging 10 and the surface 112 of the target object 110. It will be appreciated that when the lid 60 is omitted the thermal interface 70 spans at least a portion of the gap between the target object 110 and the die 40/substrate 12 (not shown).

Figure 2:
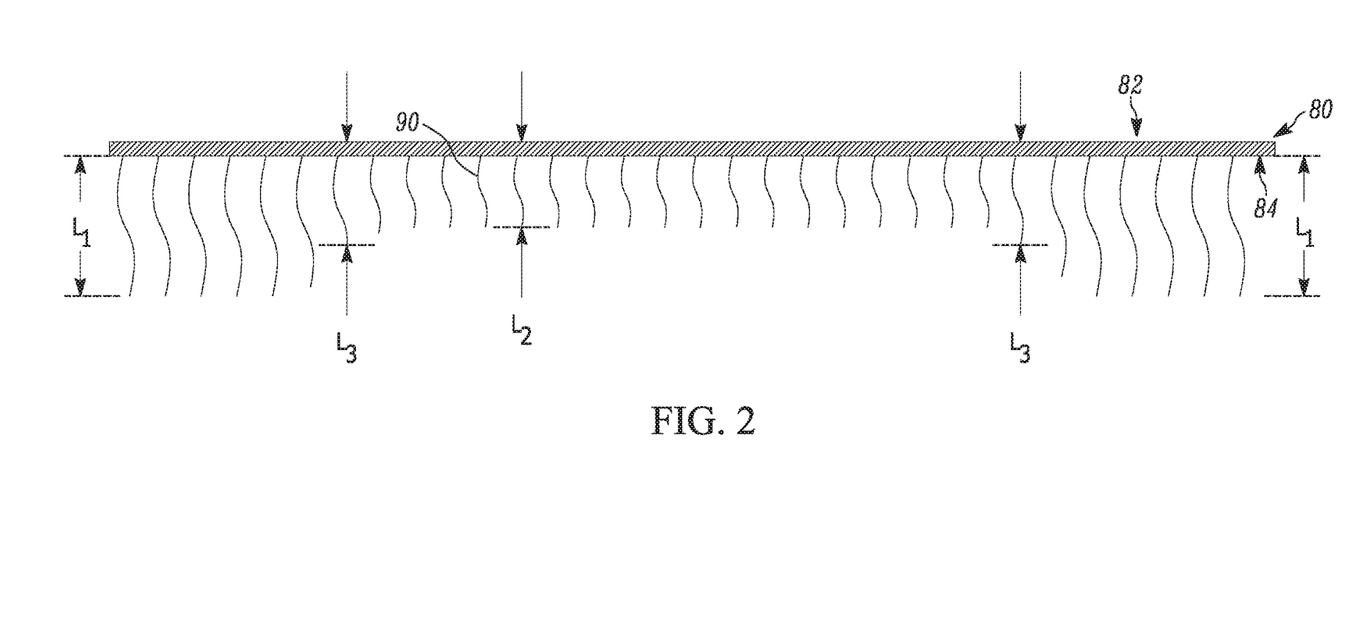
FIG. 2 is a front view of the thermal interface of FIG. 1B.

Referring further to FIG. 2, the thermal interface 70 includes a base or pad 80 having a first side 82 and a second side 84 opposite the first side. The first and second sides 82, 84 extend generally parallel to each other. Adhesive secures the first side 82 of the pad 80 to the surface 112 of the target object 110. Fibers 90 extend from the second side 84 of the pad 80. The fibers 90 can be electroflocked onto the second side 84 of the pad 80. The fibers 90 cover the entire lid 60 and are formed from a thermally conductive material, such as carbon fiber or pyrolytic graphite.

Each fiber 90 has a length referenced generally by "L" in FIG. 1B sufficient to extend from the second side 84 of the pad 80 to the lid 60. Since the angled portion 68 of the lid 60 positions the end portion 68 in a different plane from the base 62, the length L of the fibers 90 varies. More specifically, the fibers 90 extending between the second side 84 and the end portion 68 have the same first length $L_1$ sufficient to engage the end portion (see FIG. 2). The fibers 90 extending between the second side 84 and the base 62 have the same, shorter second length $L_2$ sufficient to engage the base. The fibers 90 extending between the second side 84 and the angled portion 66 have a variable third length $L_3$ that decreases in a direction extending from the end portion 68 to the base 62 and is sufficient to engage the angled portion. Due to this configuration, the fibers 90 have a stepped or variable length construction.

The fibers 90 are thermally conductive (thermal conductivity of about 13 to 30 W/(m*k)) and lightweight (a specific gravity of about 0.85 to 2.13 g/cm³). The fibers 90 are configured via thickness and material properties to be resilient and withstand repetitive bending. Although relatively few fibers 90 are shown it will be appreciated that the density of the fibers on the pad 80 can be configured to meet a desired thermal conductivity value for the thermal interface 70.

In electronics packing parlance, the combined thermal resistance from the integrated circuit junction to the case is known as Theta-JC. In this instance, the Theta-JC is associated with the combined thermal resistance from the electronics packaging 10 to the target object 110. Theta-JC is quantified by adding up the thermal resistance of the interface between the lid 60 and the thermal interface 70, the thermal resistance of the thermal interface itself, and the thermal resistance of the interface between the thermal interface and the target object. These resistances are arranged in series and therefore the combined resistance is cumulative. The values are expressed in ° C./W and it is desirable to minimize Theta-JC to maximize heat removal from the electronics packaging 10.

That said, configuring the fibers 90 to the stepped contour of the electronics packaging 10—with or without the lid 60—provides a thermal interface 70 across the entire electronics packaging and thereby maximizes the ability of the thermal interface to direct heat towards the target object 110. To this end, the thermal conductivity of the fibers 90 lowers the thermal resistance of the thermal interface 70 and thereby lowers the Theta-JC.

The fibers 90 are advantageous over existing thermal interfaces due to their relatively softer and more flexible construction. As noted, existing thermal interfaces can be relatively hard and rigid, which places undue stress on the electronics packaging. The softer, more resilient fibers 90 of the present invention more readily accommodate the contours of the electronics package 10 and therefore impart less stress thereon.

Figure 3:
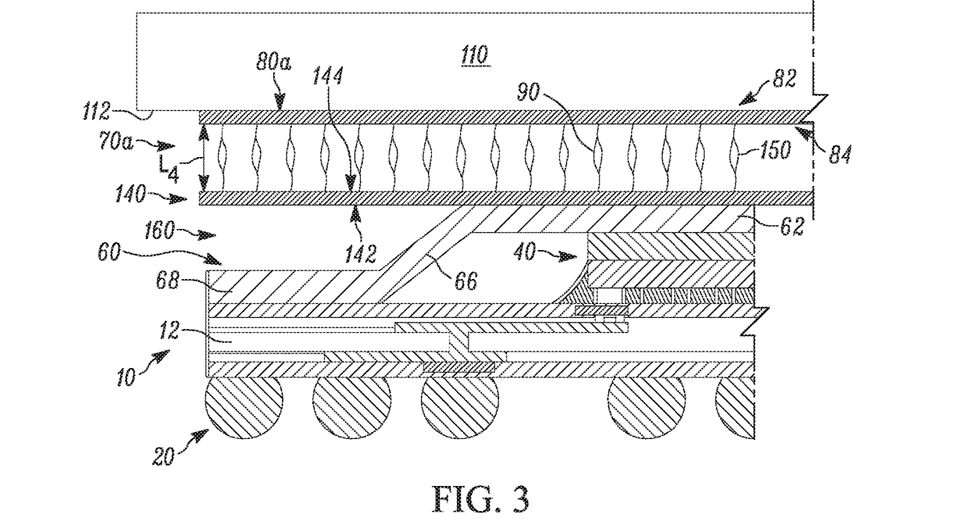
FIG. 3 is a schematic illustration of another example thermal interface including opposing, entangled fibers.

In another example shown in FIG. 3, a thermal interface 70a includes a pad 80a and a second pad 140 provided between the electronics package 10 and the pad 80a. The pad 80a is the same as the pad 80 except that the fibers 90 extending from the pad 80a are different from the fibers extending from the pad 80.

The second pad 140 is planar and has a first side 142 and a second side 144 opposite the first side. The first and second sides 142, 144 extend generally parallel to each other. Fibers 150 extend from the second side 144 of the second pad 140.

Adhesive secures the first side 82 of the pad 80a to the surface 112 of the target object 110. Adhesive secures the first side 142 of the second pad 140 to the exterior surface of the base 62. As a result, the fibers 90, 150 extend towards one another. The fibers 90 on the pad 80a have the same fourth length $L_4$. The fibers 150 on the second pad 140 also have the same fourth length $L_4$. The fourth length $L_4$ can be sized such that the fibers 90 engage the opposing second pad 140 and the fibers 150 engage the opposing pad 80a. Alternatively, the fibers 90, 150 terminate prior to the respective opposing pad 80a, 140 (not shown). Since the second pad 140 is planar and abuts the base 62 of the lid 60 an empty gap 160 is formed between the second pad and the portions 66, 68 of the lid 60.

The fibers 90, 150 are interspersed and entangled with one another in the gap between the lid 60 and the target object 110. Arranging opposing pads 80a, 140 with interspersed fibers 90, 150 increases the fiber surface area between the target object 110 and the lid 60, thereby increasing the thermal conductivity of the thermal interface 70a. The thermal resistance provided by the thermal interface 70a is therefore reduced, thereby advantageously reducing Theta-JC.

Figure 4:
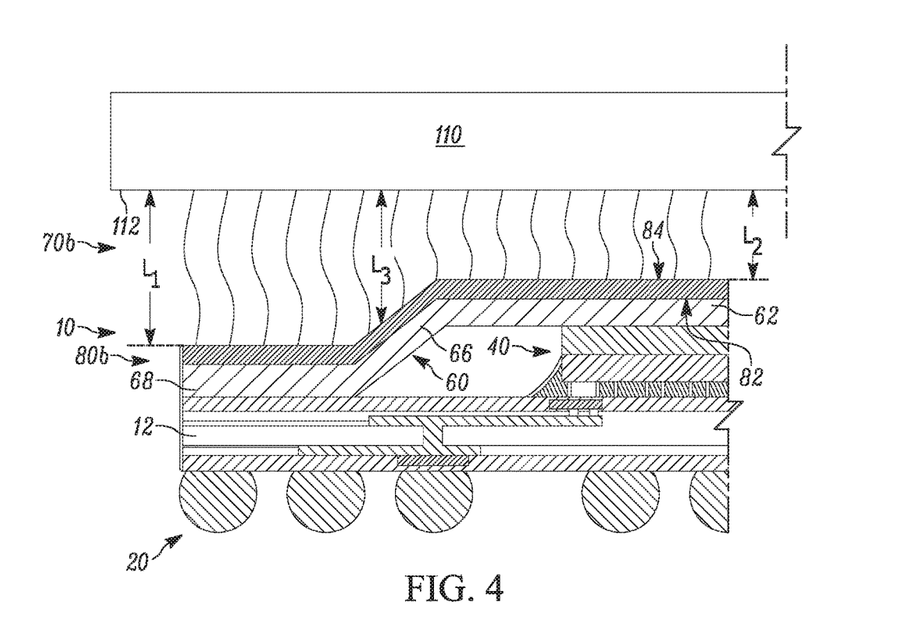
FIG. 4 is a schematic illustration of another example thermal interface including fibers.

In another example shown in FIG. 4, a thermal interface 70b includes a pad 80b in an upside-down configuration relative to the pad 80 in FIG. 1B. More specifically, in FIG. 4, the first side 82 of the pad 80b is secured to the exterior of the lid 60. The pad 80b is contoured to the shape of the lid 60 and abuts the base 62, angled portion 66, and end portion 68. Consequently, the pad 80b has a non-planar shape.

The fibers 90 extend away from the lid 60 towards the target object 110 and engage the surface 112. The fibers 90 adjacent the end portion 68 extending between the second side 84 and the surface 112 have the same first length $L_1$ sufficient to engage the surface. The fibers 90 adjacent the base 82 and extending between the second side 84 and the surface 112 have the same second length $L_2$ sufficient to engage the surface. The fibers 90 adjacent the angled portion 66 and extending between the second side 84 and the surface 112 have the variable third length $L_3$ that decreases in a direction extending from the end portion 68 to the base 62.

Figure 5:
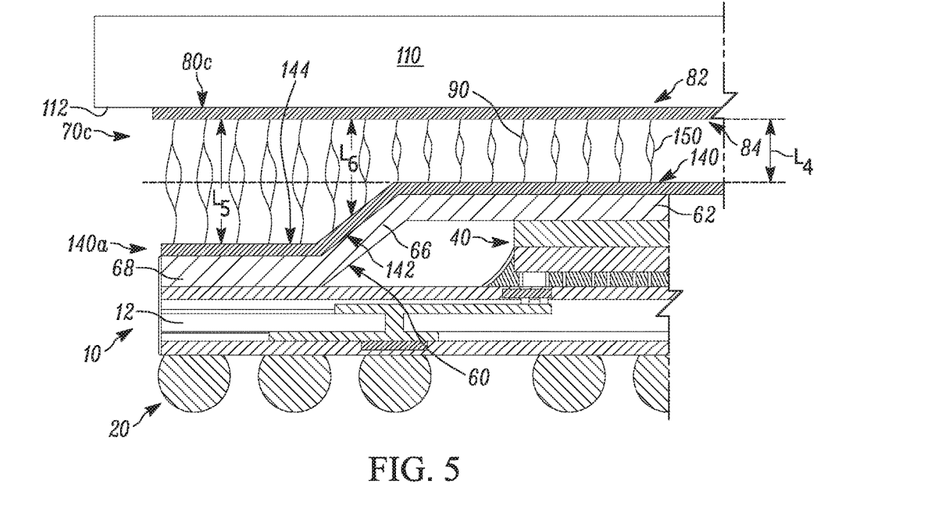
FIG. 5 is a schematic illustration of another example thermal interface including opposing, entangled fibers.

In another example shown in FIG. 5, a thermal interface 70c includes both a pad 80c and a second pad 140a. The sides 82, 142 of the pads 80c, 140a are secured to the surface 112 and the lid 60, respectively, such that the fibers 90, 150 extend towards one another. The pad 80c has the same planar contour as the surface 112. The pad 140a has the same contour as the lid 60. Consequently, the fibers 90, 150 on each pad 80a, 140a have a stepped or variable length configuration that spans the entire gap between the target object 110 and the lid 60.

The fibers 90, 150 adjacent the base 62 and extending between the respective second sides 84, 144 each has the same fourth length $L_4$. The fibers 90, 150 extending between the respective second sides 84, 144 and the end portion 68 have the same fifth length $L_5$. The fibers 90, 150 extending between the respective second sides 84, 144 and the angled portion 68 have a variable sixth length $L_6$ that decreases in a direction extending from the end portion 68 to the base 62 and is sufficient to intersperse and entangle the fibers 90, 150 with one another.

Figure 6:
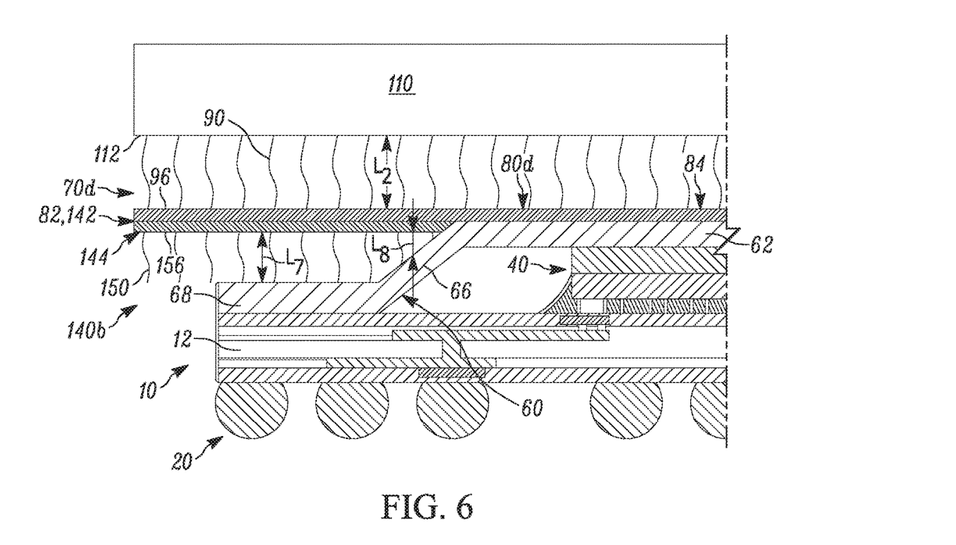
FIG. 6 is a schematic illustration of another example thermal interface including fibers extending in opposite directions.

In another example shown in FIG. 6, a thermal interface 70d includes both a pad 80d and a second pad 140b. Both pads 80d, 140b are planar. The pads 80d, 140b are positioned back-to-back with one another such that the fibers 90, 150 extend in opposite directions, i.e., the fibers 90 extend towards and engage the surface 112 and the fibers 150 extend towards and engage the lid 60. Adhesive secures the first side 82 of the pad 80d to the first side 142 of the pad 140b. Adhesive also secures the first side 82 of the pad 80d to the base 62 of the lid 60. The pad 80d rests atop (as shown) the base 62 of the lid 60. The pad 140b encircles the base 62 and rests atop the end portion 68.

Together, the pads 80d, 140b span the entire gap between the target object 110 and the lid 60. The fibers 90 have the same second length $L_2$. The fibers 150 adjacent the end portion 68 and extending between the second side 144 and the end portion have the same seventh length $L_7$ sufficient to engage the end portion. The fibers 150 adjacent angled portion 66 and extending between the second side 144 and the angled portion 86 have a variable eighth length $L_8$ that decreases in a direction extending from the end portion 68 to the base 62 and is sufficient to engage the angled portion.

Moreover, each of the pads 80d, 140b has a larger footprint than the lid 60. In particular, a portion 96 of the pad 80d extends laterally outward (to the left as shown) of the end portion 68 of the lid 60. The portion 96 extends along the entire periphery of the pad 80d.

A portion 156 of the pad 140b extends laterally outward of the end portion 68 of the lid 60. The portion 156 extends along the entire periphery of the pad 140b. Fibers 90, 150 extend from both portions 96 and 156, respectively. The portions 96, 156 increase the surface area of the pads 80d, 140b and thereby provide a larger target area for heat to pass from the electronics packaging 10 to the thermal interface 70d and, ultimately, to the target object 110. This increases the thermal conductivity of the thermal interface 70d, which reduces Theta-JC. More specifically, the heat spreads outward from the lid 60 to the portions 96, 156 based on the material properties of the lid to advantageously exhibit a wider heat spread angle to increase heat transfer.

Figure 7:
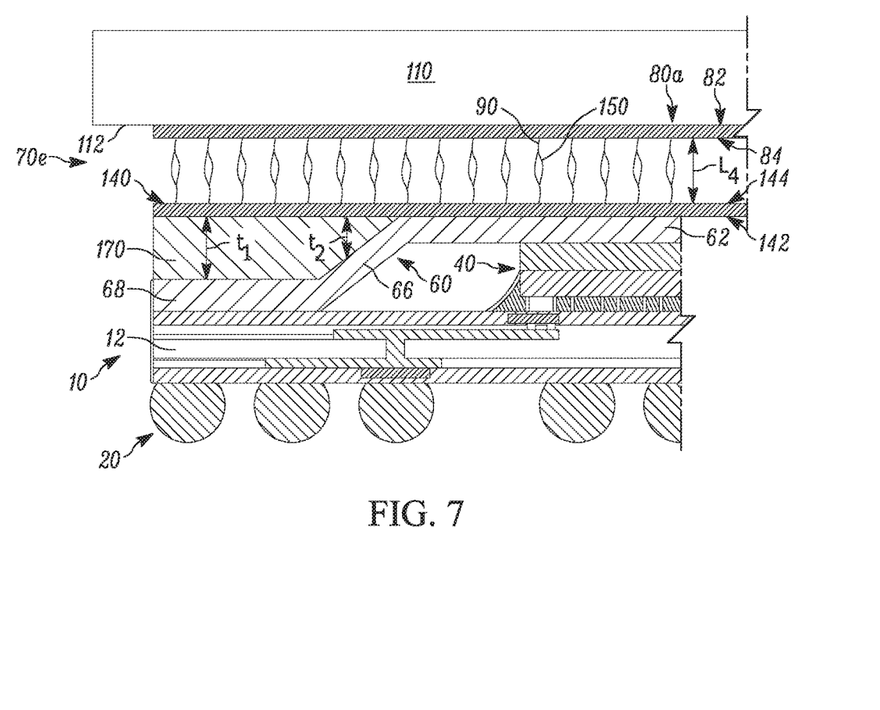
FIG. 7 is a schematic illustration of another example thermal interface including opposing, entangled fibers and a heat spreading material.

In another example shown in FIG. 7, a thermal interface 70e includes the pad 80a and the second pad 140 positioned in the same manner between the lid 60 and the target object 110 as the pad 80a and the second pad 140 in FIG. 3. The pads 80a, 140 in FIG. 7 are used in combination with a heat spreading material 170 that fills the gap 160 between the second pad 140 and the portions 66, 68 of the lid 60. The pads 80a, 140 rest atop (as shown) the base 62 of the lid 60. The heat spreader material 170 encircles the base 62 and rests atop the angled portion 66 and the end portion 68.

The portion of the heat spreader material 170 between the pad 140 and the end portion 68 has a constant first thickness $t_1$ sufficient to engage the pad 140 and the end portion. The portion of the heat spreader material 170 between the pad 140 and the angled portion 66 has a variable second thickness $t_2$ sufficient to engage the pad 140 and the angled portion. The second thickness $t_2$ decreases in a direction extending from the end portion 68 to the base 62.

The heat spreader material 170 is chosen to have high thermal conductivity, e.g., from about 700 to 2000 W/m*k. The heat spreader material 170 can be, for example, a pyrolytic graphite sheet having one or more layers with highly oriented graphite powder.

Figure 8:
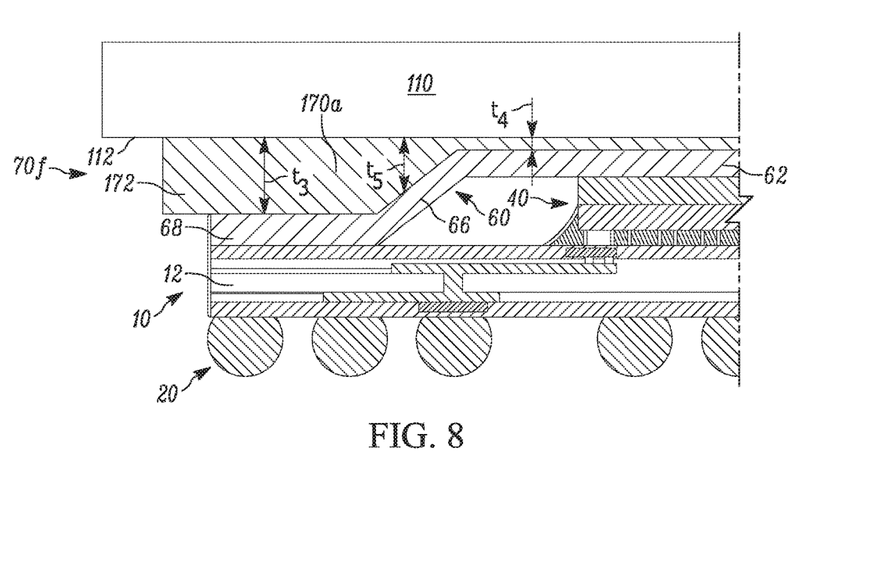
FIG. 8 is a schematic illustration of another example thermal interface including a heat spreading material.

In another example shown in FIG. 8, a thermal interface 70f includes a heat spreader material 170a that spans the entire gap between the target object 110 and the lid 60. To this end, the portion of the heat spreader material 170a between the surface 112 and the end portion 68 has a constant third thickness $t_3$ sufficient to engage the surface and the end portion. The portion of the heat spreader material 170a between the surface 112 and the base 62 has a constant fourth thickness $t_4$ sufficient to engage the surface and the base. The portion of the heat spreader material 170a between the surface 112 and the angled portion 66 has a variable fifth thickness $t_5$ sufficient to engage the surface 112 and the angled portion. The fifth thickness $t_5$ decreases in a direction extending from the end portion 68 to the base 62.

Additionally, the heat spreader material 170a has a larger footprint than the lid 60 and, thus, a portion 172 of the heat spreader material extends outward of the end portion 68 of the lid. This is advantageous for the reasons previously discussed.

Figure 9:
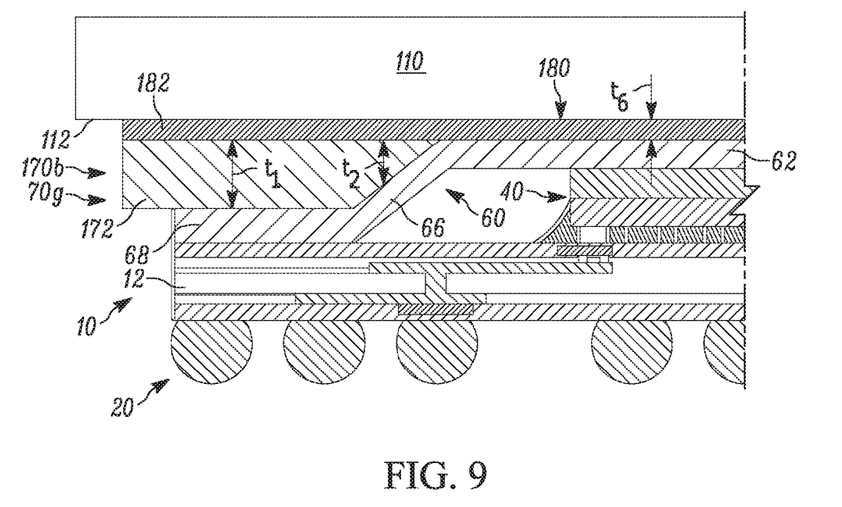
FIG. 9 is a schematic illustration of another example thermal interface including multiple heat spreading materials.

In another example shown in FIG. 9, a thermal interface 70g includes a first heat spreader material 170b and a second heat spreader material 180 that cooperate to span the entire gap between the target object 110 and the lid 60. The first heat spreader material 170b abuts the end portion 68 and the angled portion 66 of the lid 60. The second heat spreader material 180 abuts the first heat spreader material 170b and the base 62 of the lid 60. The second heat spreader material 180 also abuts the surface 112 of the target object 110.

The portion of the first heat spreader material 170b extending between the second heat spreader material 180 and the end portion 68 has the constant thickness $t_1$. The portion of the first heat spreader material 170b extending between the surface 112 and the angled portion 66 has the variable thickness $t_2$ that decreases in a direction extending from the end portion 68 to the base 62. The second heat spreader material 170b has a constant thickness $t_6$. Both heat spreader materials 170b, 180 have portions 172 and 182, respectively, which extend outwardly beyond the end portion 68 of the lid 60.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A thermal interface for positioning between an electronics packaging and a target object, comprising:
   a pad having a first side facing one of the electronics packaging and the target object and a second side, carbon fibers having varying lengths extending from the second side towards the other of the electronics packaging and the target object, wherein the fibers have a uniform first length along a first portion of the electronics packaging and a uniform second length different from the first length along a second portion of the electronics packaging.

2. The thermal interface of claim 1, wherein the fibers have a varying third length different from the first and second lengths along a third portion of the electronics packaging.

3. The thermal interface of claim 2, wherein the fibers having the third length are separated from the fibers having the first length and the fibers having the second length.

4. The thermal interface of claim 2, wherein the fibers having the first length collectively surround the fibers having the third length and the fibers having the third length collectively surround the fibers having the second length.

5. The thermal interface of claim 1 further comprising a second pad positioned between the first pad and the electronics packaging and including carbon fibers extending towards and entangled with the fibers on the pad.

6. The thermal interface of claim 5, wherein the fibers on the second pad have varying lengths.

7. The thermal interface of claim 1 further comprising a second pad positioned between the pad and the target object and including carbon fibers, the fibers on the pad and the fibers on the second pad extending in opposite directions away from one another.

8. The thermal interface of claim 7, wherein a portion of each pad extends outward of the electronics packaging such that each pad has a larger footprint than the electronics package.

9. The thermal interface of claim 1, wherein the pad is planar and the first side is secured to the target object with the fibers extending towards the electronics packaging.

10. The thermal interface of claim 1, wherein the pad is non-planar and the first side is secured to the electronics packaging with the fibers extending towards the target object.

11. The thermal interface of claim 1, wherein the carbon fibers have a thermal conductivity of about 13 to 30 W/m*k.

12. The thermal interface of claim 1, wherein the fibers having the first length collectively surround the fibers having the second length.

13. The thermal interface of claim 1, wherein the fibers having the first length are separated from the fibers having the second length.

14. A thermal interface for positioning between an electronics packaging and a target object, comprising:

a first pad having a first side for securing to the target object and a second side, carbon fibers extending from the second side towards the electronics packaging; and a second pad having a first side for securing to the electronics packaging and a second side, carbon fibers extending from the second side towards the first pad so as to be interspersed with the fibers on the first pad.

15. The thermal interface of claim 14, wherein the first and second pads are planar.

16. The thermal interface of claim 14, wherein the fibers on the first pad have the same length as the fibers on the second pad.

17. The thermal interface of claim 14, wherein an empty gap is provided between the second pad and a portion of the electronics packaging.

18. The thermal interface of claim 14 further comprising a heat spreader material provided in a gap between the second pad and a portion of the electronics packaging.

19. The thermal interface of claim 14, wherein the carbon fibers have a thermal conductivity of about 13 to 30 W/m*k.

20. A thermal interface for positioning between an electronics packaging and a target object, comprising:

at least one heat spreader material engaging the target object and the electronics packaging and including a portion extending outward of the electronics package such that the at least one heat spreader material has a larger footprint than the electronics packaging, the at least one heat spreader material comprising a first heat spreader material having a uniform thickness and a second heat spreader material having a variable thickness.

21. The thermal interface of claim 20, wherein the first heat spreader material is positioned between the target object and the second heat spreader material.

22. The thermal interface of claim 20, wherein the at least one heat spreader material comprises a single heat spreader material having a variable thickness and engaging both the target object and the electronics packaging.

* * * * *